United States Patent
Joshi et al.

(10) Patent No.: US 10,083,917 B1
(45) Date of Patent: Sep. 25, 2018

(54) POWER ELECTRONICS ASSEMBLIES AND VEHICLES INCORPORATING THE SAME

(71) Applicant: Toyota Motor Engineering & Manufacturing North America, Inc., Erlanger, KY (US)

(72) Inventors: Shailesh N. Joshi, Ann Arbor, MI (US); Yanghe Liu, Ann Arbor, MI (US); Ercan Mehmet Dede, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 0 days.

(21) Appl. No.: 15/466,176

(22) Filed: Mar. 22, 2017

(51) Int. Cl.
| | | |
|---|---|---|
| H01L 29/49 | (2006.01) | |
| H01L 23/00 | (2006.01) | |
| H01L 23/488 | (2006.01) | |
| H01L 21/77 | (2017.01) | |
| H01L 21/02 | (2006.01) | |

(52) U.S. Cl.
CPC ...... *H01L 23/562* (2013.01); *H01L 21/02318* (2013.01); *H01L 21/77* (2013.01); *H01L 23/488* (2013.01); *H01L 24/48* (2013.01); *H01L 24/49* (2013.01); *H01L 2224/48101* (2013.01); *H01L 2224/48105* (2013.01); *H01L 2924/13055* (2013.01); *H01L 2924/13091* (2013.01)

(58) Field of Classification Search
CPC .............................. H01L 23/562; H01L 23/488
See application file for complete search history.

(56) References Cited

U.S. PATENT DOCUMENTS

| | | |
|---|---|---|
| 5,517,062 A | 5/1996 | Lur et al. |
| 6,299,053 B1 | 10/2001 | Kamath et al. |
| 8,357,996 B2 | 1/2013 | Mieczkowski et al. |
| 8,928,121 B2 | 1/2015 | Cousin |
| 9,018,534 B2 | 4/2015 | Oi |
| 9,194,243 B2 | 11/2015 | Bolcavage et al. |
| 9,338,877 B2 | 5/2016 | Robert |
| 9,355,967 B2 | 5/2016 | Kim et al. |
| 9,761,540 B2 * | 9/2017 | Shih .................. H01L 23/562 |
| 2008/0251866 A1 * | 10/2008 | Belt ................... H01L 21/50 257/417 |
| 2014/0035120 A1 * | 2/2014 | Nishi ................. H01L 23/42 257/691 |

* cited by examiner

*Primary Examiner* — Michael Shingleton
(74) *Attorney, Agent, or Firm* — Dinsmore & Shohl LLP

(57) ABSTRACT

A power electronics assembly includes a semiconductor device, a metal substrate, and a cooling structure. The metal substrate includes a plurality of stress-relief features that extend at least partially through a thickness of the metal substrate. The plurality of stress-relief features are at least partially filled with a transient liquid phase (TLP) bonding material. The semiconductor device is positioned over the plurality of stress-relief features and thermally bonded to the metal substrate via TLP bonding material. Vehicles having power electronics assemblies with stress-relief through-features are also disclosed.

14 Claims, 8 Drawing Sheets

POWER ELECTRONICS ASSEMBLIES AND VEHICLES INCORPORATING THE SAME

TECHNICAL FIELD

The present specification generally relates to power electronics assemblies, and more particularly, power electronics assemblies having metal substrates with integral stress-relief features.

BACKGROUND

Power electronics devices are often utilized in high-power electrical applications, such as inverter systems for hybrid electric vehicles and electric vehicles. Such power electronics devices include power semiconductor devices such as power IGBTs and power transistors thermally bonded to a metal substrate. The metal substrate may then be further thermally bonded to a cooling structure, such as a heat sink.

With advances in battery technology and increases in electronics device packaging density, operating temperatures of power electronics devices have increased and are currently approaching 200° C. Accordingly, traditional electronic device soldering techniques no longer provide suitable bonding of semiconductor devices to metal substrates and alternative bonding techniques are needed. One such alternative bonding technique is transient liquid phase (TLP) sintering. TLP sintering of semiconductor devices to metal substrates utilize bonding temperatures (also referred to as sintering temperatures) between about 280° C. to about 350° C. The semiconductor devices and metal substrates have different coefficients of thermal expansion (CTE) and large thermally-induced stresses (e.g., cooling stresses) may be generated between a semiconductor device and metal substrate upon cooling from a TLP sintering temperature. The large thermal cooling stresses due to CTE mismatch between the power semiconductor device and metal substrate may result in delamination between the semiconductor device and metal substrate of a power electronics device.

Accordingly, a need exists for alternative power electronics assemblies that reduce or mitigate thermal cooling stresses between power semiconductor devices thermally bonded to metal substrates via TLP sintering.

SUMMARY

In one embodiment, a power electronics assembly includes a metal substrate with a thickness extending between a first surface and a second surface, and a plurality of stress-relief features extending from the first surface towards the second surface. A semiconductor device extends across the plurality of stress-relief features which are at least partially filled with a transient liquid phase (TLP) bonding material. The TLP bonding material is bonded to the metal substrate and the semiconductor device, thereby bonding the semiconductor device to the metal substrate. The metal substrate may comprise a bonding area where the plurality of stress-relief features are positioned and the semiconductor device is bonded to the metal substrate. The plurality of stress-relief features may occupy between about 20% to about 40% of a surface area of the bonding area. The plurality of stress-relief features may have an inner dimension d, a depth t, and an aspect ratio of t/d in the range of about 0.8 and about 1.2. The plurality of stress-relief features may comprise a first portion with a side wall and a bottom surface, the side wall extending from the first surface of the metal substrate to the bottom surface. The plurality of stress-relief features may further comprise a second portion extending from the bottom surface of the first portion towards the second surface of the metal substrate. The metal substrate may be formed from copper, the semiconductor device may be formed from a wide band gap semiconductor material comprising at least one of silicon carbide (SiC), silicon dioxide ($SiO_2$), aluminum nitride (AlN), gallium nitride (GaN), boron nitride (BN) and diamond, and the TLP bonding material may be a silver-tin (Ag—Sn) TLP bonding material.

In another embodiment, a process for forming a power electronics assembly includes forming a plurality of stress-relief features within a metal substrate, filling the plurality of stress-relief features with a transient liquid phase (TLP) paste and positioning a semiconductor device over the metal substrate in direct contact with the TLP paste. The metal substrate, TLP paste and semiconductor device are heated to a sintering temperature and the TLP paste at least partially melts, isothermally solidifies and forms a TLP bonding material between the semiconductor device and the metal substrate. The metal substrate, TLP bonding material and semiconductor device are cooled from the sintering temperature to ambient temperature and the semiconductor device is bonded to the metal substrate via the TLP bonding material. The plurality of stress-relief features may have a hollow cylindrical shape with a depth t, an inner diameter d and an aspect ratio t/d in the range of about 0.8 to about 1.2. The metal substrate may comprise a first surface with a bonding area and the plurality of stress-relief features may be formed within the bonding area and occupy between 20% and 40% of a surface area of the bonding area. The semiconductor device may be positioned over the bonding area in direct contact with the TLP paste. The process may comprise forming the plurality of stress-relief features with a first portion having a side wall and a bottom surface, the side wall extending from a first surface of the metal substrate to the bottom surface. The process may further comprise forming the plurality of stress-relief features with a second portion extending from the bottom surface of the first portion towards a second surface of the metal substrate. During heating of the metal substrate, TLP bonding material and semiconductor device to the sintering temperature, the second portion provides a vent for degassing of the TLP paste.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
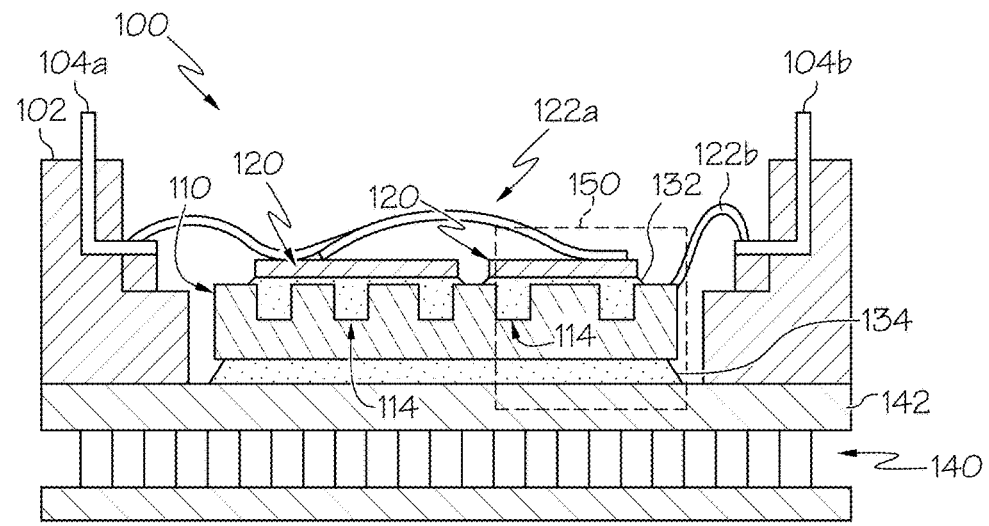
FIG. 1 schematically depicts a side view of a power electronics assembly having a power semiconductor device thermally bonded to a metal substrate with stress-relief features according to one or more embodiments shown and described herein.

FIG. 1 generally depicts one embodiment of a power electronics assembly. The power electronics assembly comprises a power semiconductor device (semiconductor device) thermally bonded to a metal substrate with a plurality of stress-relief features that alleviate or mitigate thermally-induced stresses generated or resulting from fabrication and operation of the power electronics assembly. The thermally-induced stresses are due to coefficient of thermal expansion (CTE) mismatch between the semiconductor device and metal substrate of the power electronics assembly. The stress-relief features may extend into the metal substrate beneath the semiconductor device that is thermally bonded to the metal substrate and inhibits delamination between the semiconductor device and metal substrate of the power electronics assembly. Various embodiments of power electronics assemblies and vehicles using power electronics assemblies will be described in more detail herein.

Referring initially to FIG. 1, one embodiment of a power electronics assembly 100 is illustrated. The power electronics assembly 100 generally comprises a metal substrate 110 with a plurality of stress-relief features 114, two semiconductor devices 120, a cooling structure 140, and a package housing 102. A TLP bonding material 132 bonds or couples the two semiconductor devices 120 to the metal substrate 110.

The thicknesses of the metal substrate 110 and the semiconductor devices 120 may depend on the intended use of the power electronics assembly 100. In one embodiment, the metal substrate 110 has a thickness within the range of about 2.0 mm to about 4.0 mm, and the semiconductor device 120 has a thickness within the range of about 0.1 mm to about 0.3 mm. For example and without limitation, the metal substrate may have a thickness of about 3.0 mm and the semiconductor device 120 may have a thickness of about 0.2 mm. It should be understood that other thicknesses may be utilized.

The metal substrate 110 may be formed from a thermally conductive material such that heat from the semiconductor devices 120 is transferred to the cooling structure 140. The metal substrate may be formed copper (Cu), e.g., oxygen free Cu, aluminum (Al), Cu alloys, Al alloys, and the like. The semiconductor devices 120 may be formed from a wide band gap semiconductor material suitable for the manufacture or production of power semiconductor devices such as power IGBTs and power transistors. In embodiments, the semiconductor devices 120 may be formed from wide band gap semiconductor materials including without limitation silicon carbide (SiC), silicon dioxide ($SiO_2$), aluminum nitride (AlN), gallium nitride (GaN), boron nitride (BN), diamond, and the like. In embodiments, the metal substrate 110 and the semiconductor devices 120 may comprise a coating, e.g., nickel (Ni) plating, to assist in the TLP sintering of the semiconductor devices 120 to the metal substrate 110.

As depicted in FIG. 1, a TLP bonding material 132 is bonded to the metal substrate 110 and two semiconductor devices 120, thereby bonding the two semiconductor devices 120 to the metal substrate 110. In one embodiment, the TLP bonding material 132 may be silver-tin (Ag—Sn) bonding material. Other bonding materials may be utilized. More or fewer semiconductor devices 120 may be attached to the metal substrate 110. In some embodiments, heat generating devices other than power semiconductor devices may be attached to the metal substrate 110. The semiconductor devices 120 may be power semiconductor devices such as IGBTs, power diodes, power MOSFETs, power transistors, and the like. In one embodiment, the semiconductor devices 120 of one or more power electronics assemblies are electrically coupled to form an inverter circuit or system for vehicular applications, such as for hybrid vehicles or electric vehicles, for example.

The metal substrate 110 is thermally coupled to the cooling structure 140 via a bond layer 134. In one embodiment, the cooling structure 140 comprises an air-cooled heat sink. In an alterative embodiment, the cooling structure 140 comprises a liquid-cooled heat sink, such as a jet impingement or channel-based heat sink device. The metal substrate 110 of the illustrated embodiment is directly bonded to a first surface 142 of the cooling structure 140 via the bond layer 134 without any additional interface layers (e.g., additional metal base plates). The metal substrate 110 may be bonded to the cooling structure 140 using a variety of bonding techniques, such as by TLP sintering, solder, brazing, or diffusion bonding, for example. However, in an alterative embodiment, one or more thermally conductive interface layers may be positioned between the metal substrate 110 and the cooling structure 140.

Still referring to FIG. 1, the metal substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example.

Within the power electronics assembly 100 may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 122a, and the second electrical contact 104b is electrically coupled to a second surface of the semiconductor devices 120 via a second electrical wire 122b and the metal substrate 110. It should be understood that other electrical and mechanical configurations are possible, and that embodiments are not limited by the arrangement of the components illustrated in the figures.

Figure 2:
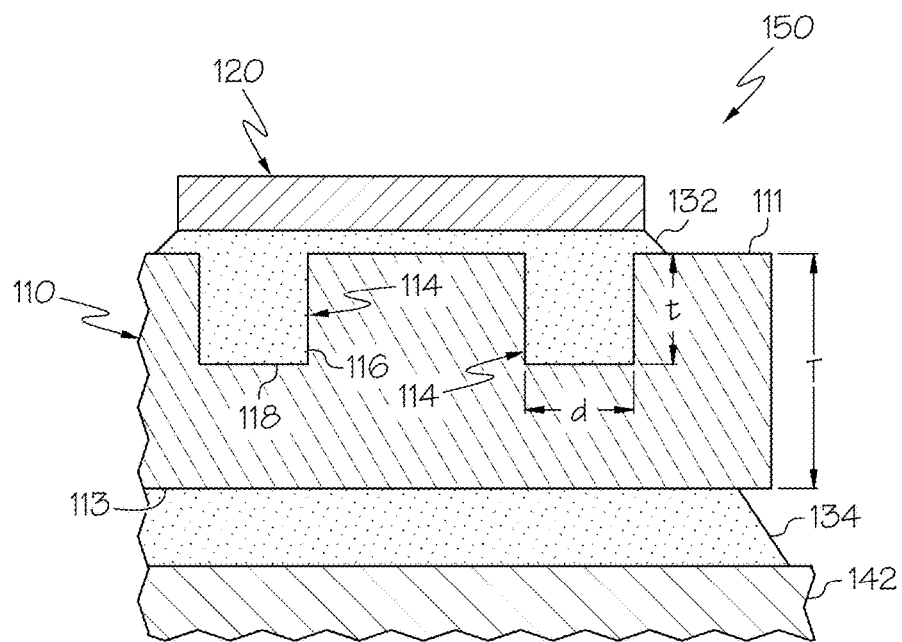
FIG. 2 schematically depicts an enlarged view of box 150 depicted in FIG. 1.

Referring now to FIG. 2, the region of power electronics assembly 100 illustrated in FIG. 1 and designated by box 150 is schematically depicted. The metal substrate 110 comprises a plurality of stress-relief features 114 that extend from a first surface 111 of the metal substrate 110 towards a second surface 113. The stress-relief features 114 described herein are provided within the metal substrate 110 to remove or mitigate thermally-induced stresses, e.g., thermal cooling stresses, resulting from fabrication (e.g., TLP sintering) and operational conditions (e.g., transient electric loads causing high changes in temperature). Because the metal substrate 110 and semiconductor devices 120 of the power electronics assembly 100 are made of differing materials, differences in the CTE for each material may cause large thermally-induced stresses within the metal substrate 110, semiconductor devices 120 and TLP bonding material 132. It should be understood that the large thermally-induced stresses may result in failure of the power electronics assembly 100 due to fracturing of the metal substrate 110 or failure of the TLP bonding material 132 (e.g., delamination) between the metal substrate 110 and one or both of the semiconductor devices 120. The use of the stress-relief features 114 within the metal substrate 110 alleviate or mitigate such stresses without the need for additional interface layers. The stress-relief features 114 described herein control the thermal expansion and contraction experienced by the metal substrate 110, and in the alternative or in addition to, control the stiffness of the metal substrate 110. In some embodiments, the stress-relief features 114 described herein may be filled with a TLP bonding material 132 to manipulate thermal expansion and contraction of the metal substrate 110. In the alternative, or in addition to manipulating thermal expansion and contraction of the metal substrate 110, the stress-relief features 114 described herein may be filled with a TLP bonding material 132 to manipulate the stiffness of the metal substrate 110. As used herein, the term stiffness refers to the rigidity of an object, i.e., the extent to which an object resists deformation in response to an applied force.

Figure 3A:
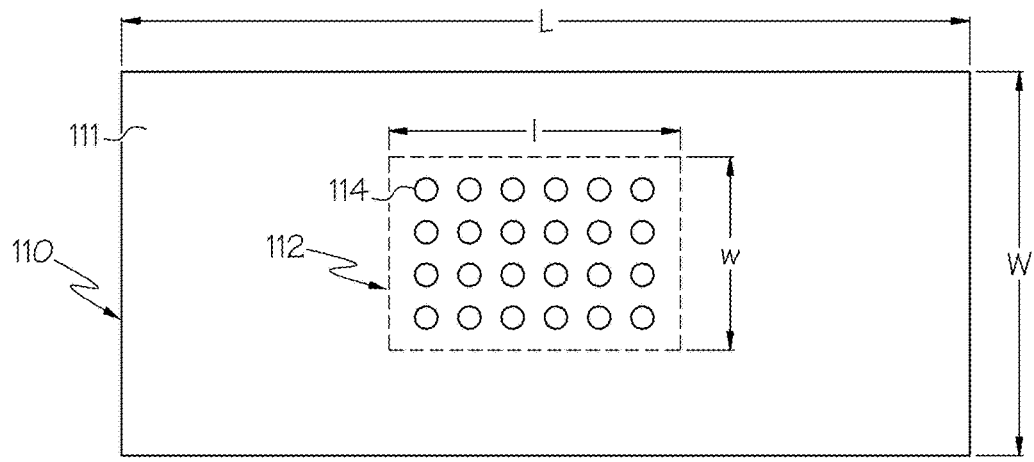
FIG. 3A schematically depicts a top view of a metal substrate with stress-relief features according to one or more embodiments shown and described herein.

The stress-relief features 114 described herein may be located in a bonding area 112 (FIG. 3A) where the semiconductor devices 120 extend over the metal substrate 110. As used herein, the term "bonding area" is defined as the footprint of the semiconductor device 120 positioned on the metal substrate 120 with the outer perimeter of the semiconductor devices 120 demarcating the outer boundaries of the bonding area 112. To optimize thermal transfer between the semiconductor device 120 and the metal substrate 110, the percentage of surface area occupied by the stress-relief features 114 in the bonding area 112 is less than or equal to 50%. In embodiments, less than or equal to 40% of the bonding area 112 is occupied by the stress-relief features 114. In other embodiments, less than or equal to 30% of the bonding area 112 is occupied by the stress-relief features 114. The stress-relief features 114 may occupy more than 5% of the bonding area 112. In embodiments, the stress-relief features 114 may occupy more than 10% of the bonding area 112. In other embodiments, the stress-relief features 114 may occupy more than 20% of the bonding area 112. For example and without limitation, the stress-relief features 114 may occupy between about 25% to about 30% of the surface area of the bonding area 112.

Generally, each of the plurality of stress-relief features 114 comprises a hollow shape with a side wall 116 and a bottom surface 118. The stress-relief features 114 have a depth 't' and an inner dimensions 'd'. The shape of the stress-relief features 114 in cross-section may be cylindrical with an inner diameter d. The size and spacing of the stress-relief features 114 fabricated in the metal substrate 110 may depend on the overall size of the semiconductor devices 120, the application in which the power electronics assembly 100 is to be implemented, the TLP sintering temperature used to thermally bond the semiconductor devices 120 to the metal substrate 110, etc. In embodiments, the stress-relief features 114 have a ratio of the depth t to the inner dimension d (referred to herein as an aspect ratio=t/d) in the range of about 0.5 to about 1.5. In embodiments, the aspect ratio of the stress-relief features 114 is in the range of about 0.8 to about 1.2. For example and without limitation, the aspect ratio of the stress-relief features 114 may be about 1.0. Such an aspect ratio may be obtained by the stress-relief features 114 having a diameter d between about 0.5 mm to about 2.0 mm and a depth t between about 0.5 mm to about 2.0 mm. In embodiments, the stress-relief features 114 have a diameter d between about 1.4 mm and about 1.6 mm and a depth d between about 1.4 mm and about 1.6 mm.

As shown in FIG. 2, the stress-relief features 114 extend from the first surface 111 of the metal substrate 110 towards the second surface 113 and do not extend completely through the metal substrate 110. The stress-relief features 114 may be generally cylindrical but may have a taper depending on the method used to fabricate the stress-relief features 114.

The stress-relief features 114 may be fabricated using a variety of techniques. In one embodiment, the stress-relief features 114 are fabricated using mechanical or laser drilling. In another embodiment, a chemical etching process is used in which a patterned mask is applied to the metal substrate 110 and a chemical etchant forms the stress-relief features 114.

As shown in FIGS. 3A-3D, the stress-relief features 114 may comprise different patterns within the bonding area 112 of the metal substrate 110. The metal substrate 110 may be rectangular in shape and have a length 'L' and width 'W', and the bonding area 112 may be rectangular in shape and have a length 'l' and a width 'w'. The length L of the metal substrate 110 may be between about 20 mm and about 100 mm, and the width W may be between about 5 mm and about 50 mm. In embodiments, the length L of the metal substrate 110 is between about 20 mm and about 50 mm, and the width W is between about 10 mm and about 30 mm. In other embodiments, the length L of the metal substrate 110 is between about 25 mm and about 40 mm, and the width W is between about 15 mm and about 20 mm. For example and without limitation, the length L of the metal substrate may be about 35 mm and the width W may be about 18 mm. The length l of the bonding area 112 may be between about 5 mm and about 30 mm and the width w may be between about 5 mm and about 25 mm. In embodiments, the length l of the bonding area 112 is between about 7 mm and about 25 mm, and the width w is between about 5 mm and about 20 mm. In other embodiments, the length l of the bonding area 112 is between about 10 mm and about 20 mm, and the width w is between about 7 mm and about 15 mm. For example and without limitation, the length l of the metal substrate may be about 13 mm and the width w may be about 12 mm. It should be understood that other dimensions for the metal substrate 110 and bonding area 112 are possible, and that embodiments are not limited by the arrangement of the components illustrated in the figures.

Figure 3B:
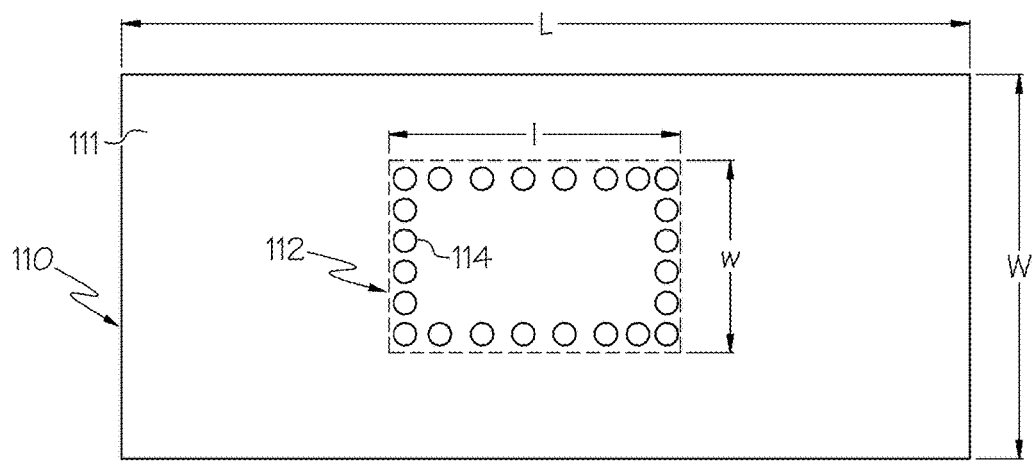
FIG. 3B schematically depicts a top view of a metal substrate with stress-relief features according to one or more embodiments shown and described herein.
Figure 3C:
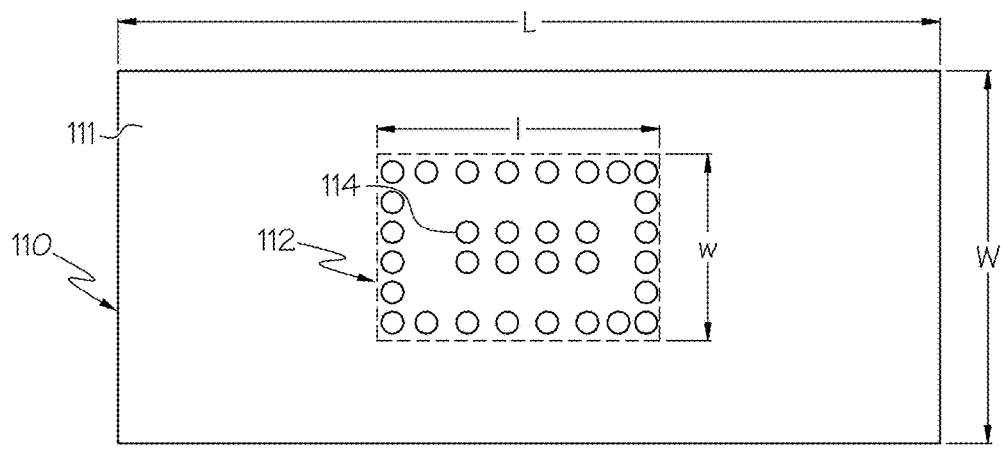
FIG. 3C schematically depicts a top view of a metal substrate with stress-relief features according to one or more embodiments shown and described herein.
Figure 3D:
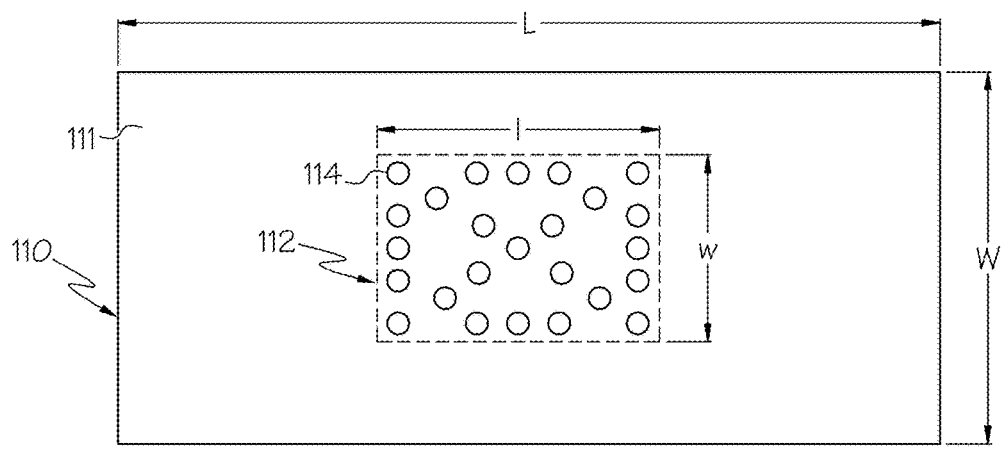
FIG. 3D schematically depicts a top view of a metal substrate with stress-relief features according to one or more embodiments shown and described herein.

Still referring to FIGS. 3A-3D, FIG. 3A depicts one pattern of the plurality of stress-relief features 114 comprising an array of regularly spaced rows and columns of stress-relief features 114. FIG. 3B depicts another pattern the plurality of stress-relief features 114 positioned only along an outer edge of the bonding area 112, i.e., a central area or central portion of the bonding area 112 is devoid of any stress-relief features 114. FIGS. 3C and 3D depict patterns of the plurality of stress-relief features 114 positioned along an outer edge of the bonding area 112 and within the central area or central portion of the bonding area 112. It should be understood that other patterns of the plurality of stress-relief features 114 are possible, and that embodiments are not limited by the patterns illustrated in the figures.

Figure 4A:
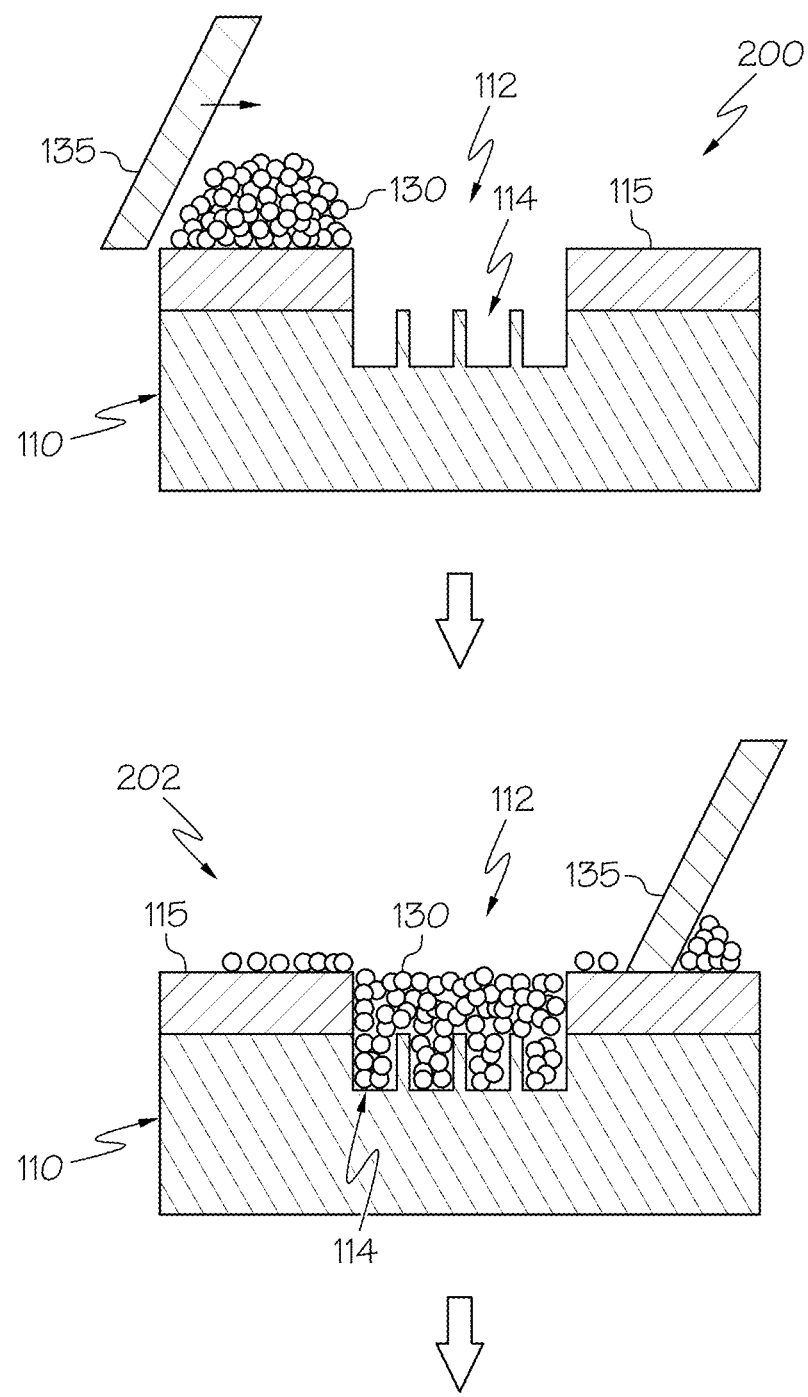
FIG. 4A schematically depicts two steps of a process for thermally bonding a power semiconductor device to a metal substrate with stress-relief features according to one or more embodiments shown and described herein.
Figure 4B:
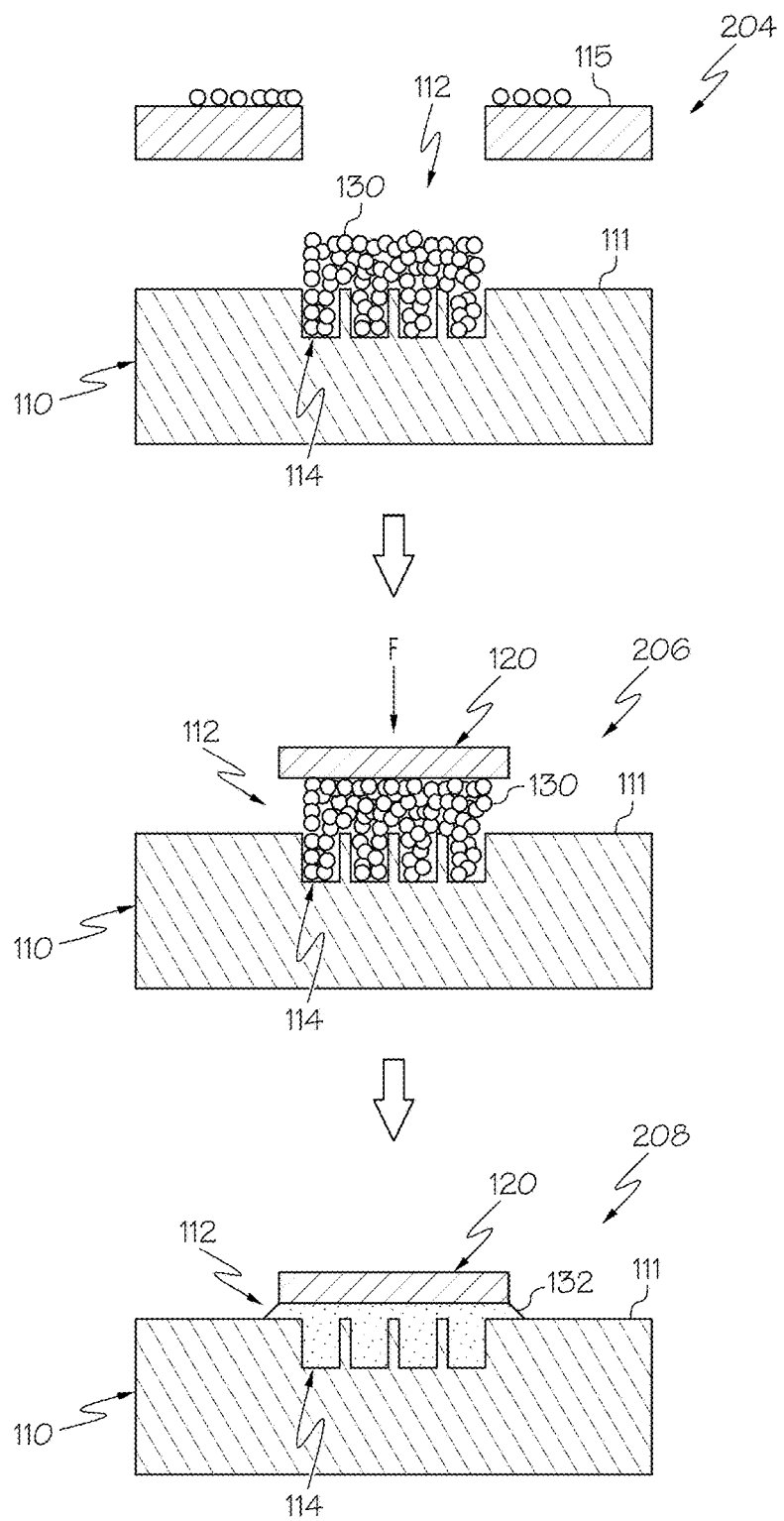
FIG. 4B schematically depicts three additional steps of the process depicted in FIG. 4A for thermally bonding a power semiconductor device to a metal substrate with stress-relief features according to one or more embodiments shown and described herein.

Referring now to FIGS. 4A and 4B, a process for thermally bonding a power semiconductor device to a metal substrate with stress-relief features is depicted. Particularly, at step 200 (FIG. 4A) a metal substrate 110 with a plurality of stress-relief features 114 is at least partially covered with a mask 115. The mask 115 provides access to the bonding area 112 and the stress-relief features 114. A TLP bonding material paste (TLP paste) 130, e.g., a Ag—Sn TLP paste, is positioned on the mask 115. At step 202 (FIG. 4A), a knife 135 spreads the TLP paste 130 across the bonding area 112 such that the TLP paste 130 flows and at least partially fills the plurality of stress-relief features 114. At step 204 (FIG. 4B) the mask 115 is removed from the metal substrate 110 thereby leaving the TLP paste 130 within the plurality of stress-relief features 114. In embodiments, the TLP paste 130 extends above the first surface 111 of the metal substrate 110 as depicted at step 204 in FIG. 4B. At step 206 (FIG. 4B), a semiconductor device 120 is positioned over the bonding area 112, plurality of stress-relief features 114 and TLP paste 130. In embodiments, the bonding area 112 with the stress-relief features 114 and the surface of the semiconductor device 120 in contact with the TLP paste 130 have a coating, e.g., a Ni coating, that assists in bonding with the TLP paste during the TLP process. The coating may be applied to the bonding area 112 and semiconductor device 120 using known methods for depositing a thin coating, e.g., 1 to 5 micrometers thick, on metal and semiconductor material surfaces, including but not limited to, electrolytic deposition, electroless deposition, physical vapor deposition, chemical vapor deposition, and the like. A force F may be applied to the semiconductor device 120 in order to hold the semiconductor device 120 in position over the bonding area 112, plurality of stress-relief features 114 and TLP paste 130 during TLP sintering. At step 208 (FIG. 4B), the metal substrate 110 with the semiconductor device 120 positioned thereon is placed within an oven (not shown) and heated to a sintering temperature, e.g., a temperature between about 280° C. and 350° C., such that the semiconductor device 120 is thermally bonded to the metal substrate 110 via TLP sintering. In embodiments, the oven may comprise an inert atmosphere, a vacuum atmosphere, etc., during the TLP sintering process. Not being bound by theory, a melting point depressant within the TLP paste 130 diffuses into the surrounding Ni coating on the metal substrate 110 and semiconductor device 120 which results in isothermal solidification of the TLP paste 130 to produce the TLP bonding material 132 that forms a bonding layer between the metal substrate 110 and semiconductor device 120. That is, the TLP bonding material 132 bonds to the metal substrate 110 and the semiconductor device 120 thereby bonding the semiconductor device 120 to the metal substrate 110.

Figure 5:
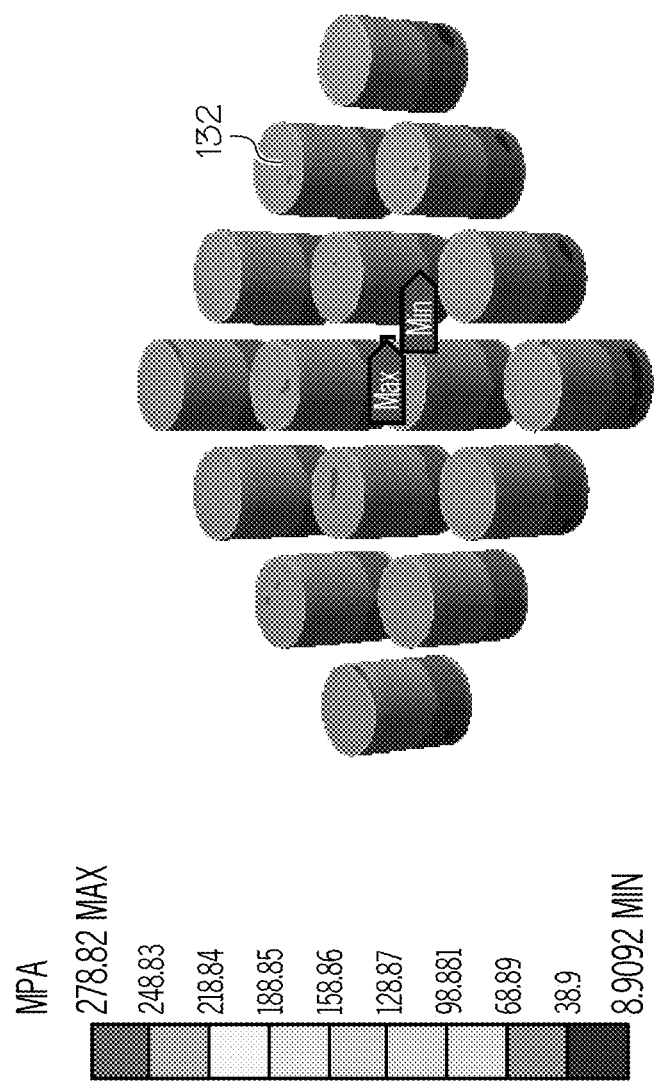
FIG. 5 depicts mathematically modeling of pillars of transient liquid phase (TLP) bonding material formed within stress-relief features in a metal substrate according to one or more embodiments shown and described herein.

Referring now to FIG. 5, results of mathematically modeling of the TLP bonding material 132 within the plurality of stress-relief features 114 are depicted. The mathematical modeling assumed a metal substrate 110 (not shown) was formed from oxygen-free Cu, had a length of 35 mm, a width of 18 mm and a thickness of 3 mm. A bonding area 112 (not shown) on a first surface 111 of the metal substrate 110 had a length of 13 mm and a width of 12 mm. Four rows of four stress-relief features 114 were positioned within the bonding area 112. Each stress-relief feature 114 was in the form of a hollow cylinder and had an aspect ratio of 1.0 with an inner diameter d equal to 1.5 mm and depth t equal to 1.5 mm. The stress-relief features 114 were filled with a Ag—Sn TLP paste to form pillars of TLP paste 130. The metal substrate 110 with the plurality of stress-relief features 114 and pillars of TLP paste 130 heated to 325° C. and then cooled to 25° C. During heating to 325° C., pillars of TLP bonding material 132 were formed from the TLP paste 130 and the maximum stress generated in the pillars of TLP bonding material 132 during cooling from 325° C. to 25° C. was calculated. The maximum stress within the pillars of TLP bonding material 132 range from about 10 MPa to about 280 MPa and was much less than modeling of a solid Cu metal substrate without the stress-relief features 114 (not shown) heated to 325° C. and cooled to 25° C. Accordingly, the mathematical modeling demonstrated that the pillars of TLP bonding material 132 mitigate thermally-induced stresses between the metal substrate 110 and semiconductor device 120 such that delamination between metal substrate 110 and semiconductor device 120 is eliminated. Not being bound by theory, the pillars of TLP bonding material 132 and stress-relief features 114 mitigate the bulk thermally-induced stress between the metal substrate 110 and semiconductor device 120 by reducing the overall CTE mismatch between the metal substrate 110 and semiconductor device 120 and/or reducing the overall stiffness of the bonding area 112 such that the metal substrate plastically yields to thermally-induced stress between the metal substrate 110 and semiconductor device 120.

Figure 6A:
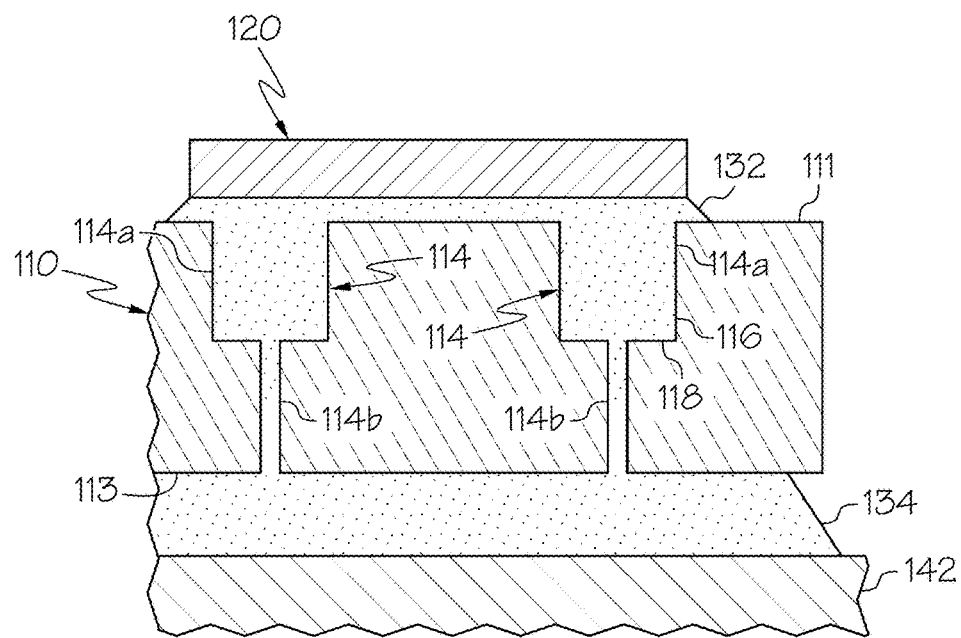
FIG. 6A schematically depicts a partial side view of a power electronics assembly having a power semiconductor device thermally bonded to a metal substrate with stress-relief features according to one or more embodiments shown and described herein.
Figure 6B:
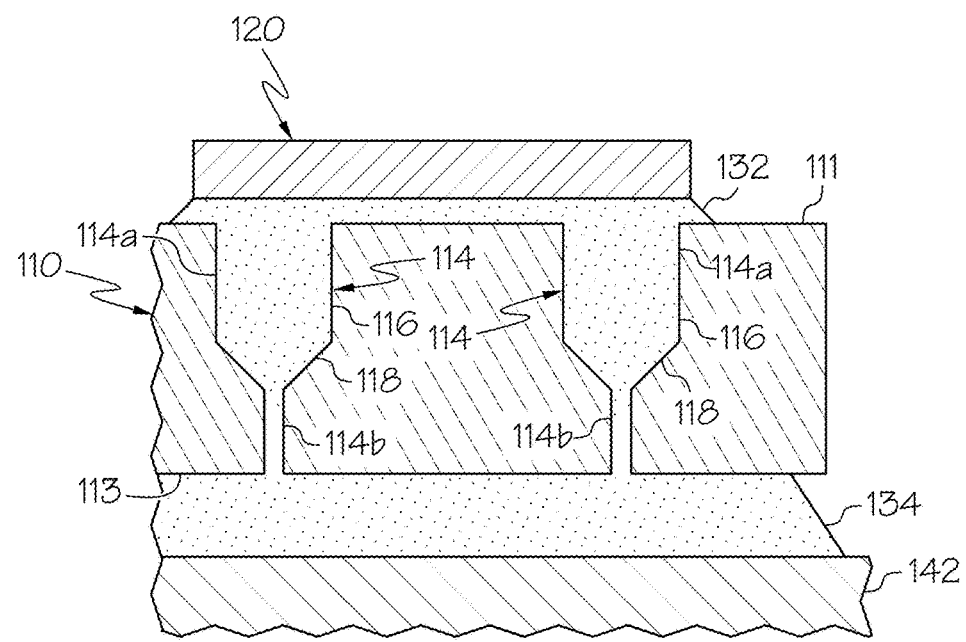
FIG. 6B schematically depicts a partial side view of a power electronics assembly having a power semiconductor device thermally bonded to a metal substrate with stress-relief features according to one or more embodiments shown and described herein.
Figure 7:
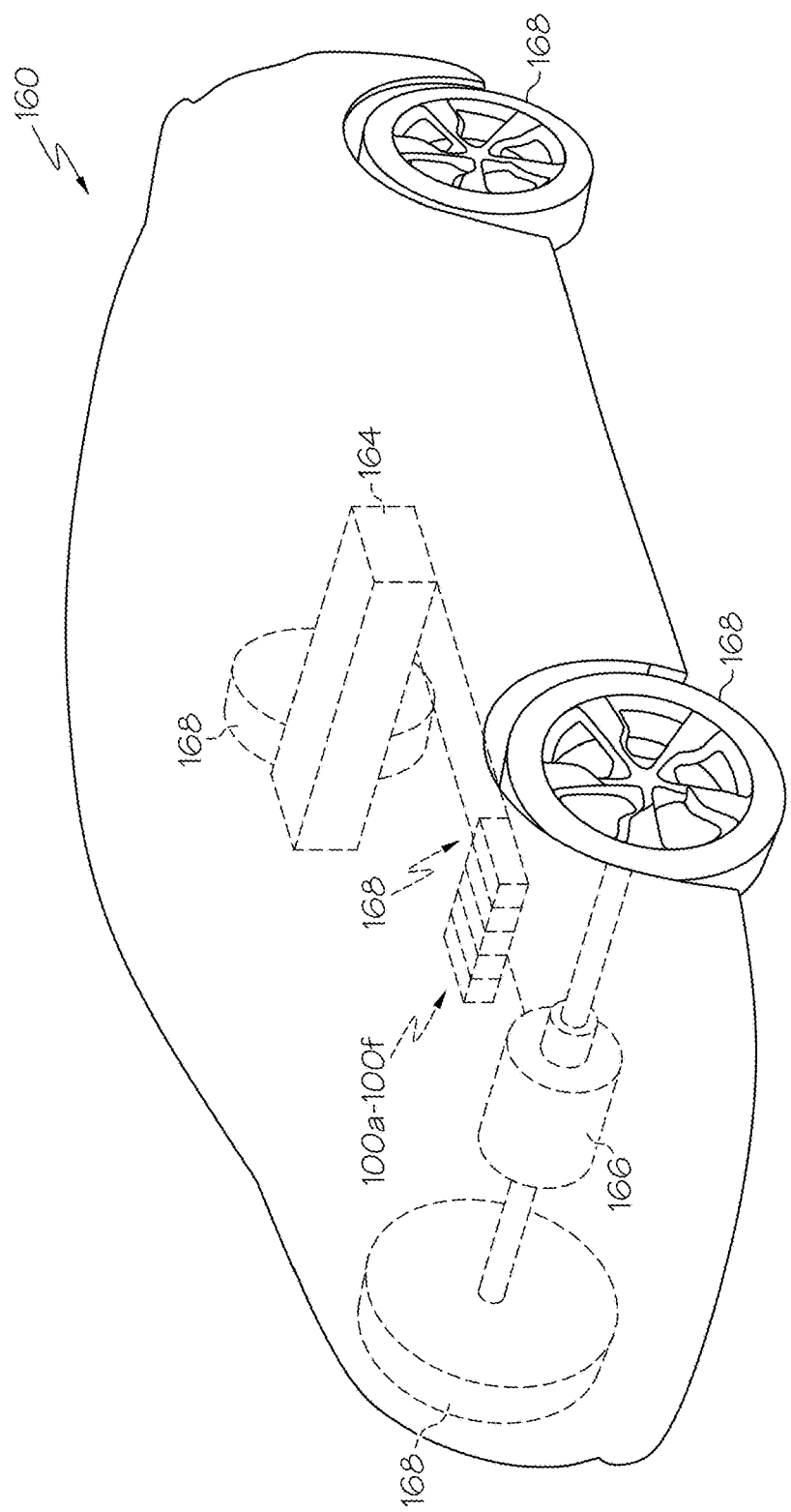
FIG. 7 schematically depicts a vehicle having a plurality of power electronics assemblies according to one or more embodiments shown and described herein.

Referring now to FIGS. 6A and 6B, other embodiments of stress-relief features 114 are depicted. Particularly, FIG. 6A depicts stress-relief features 114 comprising a first portion 114a with side wall 116 and bottom surface 118, and a second portion 114b extending from the bottom surface 118 of the first portion 114a to the second surface 113 of the metal substrate 110. The second portion 114b has an inner dimension less than the inner dimension d of the first portion. FIG. 6B depicts stress-relief features 114 comprising a first portion 114a with side wall 116 and an inclined bottom surface 118, and a second portion 114b extending from the bottom surface 118 of the first portion 114a to the second surface 113 of the metal substrate 110. The second portion 114b has an inner dimension less than the inner dimension d of the first portion 114a. The second portion 114b of the stress-relief feature 114 depicted in FIGS. 6A and 6B may assist in filling the stress-relief features 114 with the TLP paste 130. That is, the second portion 114b may prevent gas (e.g., air) pockets from forming at or near the bottom surface 118 when the TLP paste 130 flows into the stress-relief features 114. Also, the second portion 114b may serve as a vent and assist in degassing of the TLP paste 130 during the TLP sintering process.

As stated above, the metal substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 6, several power electronics assemblies 100a-100f may be electrically coupled together to form a drive circuit that converts direct current electrical power provided by a bank of batteries 164 into alternating electrical power that is used to drive an electric motor 166 coupled to the wheels 168 of a vehicle 160 to propel the vehicle 160 using electric power. The power electronics assemblies 100a-100f used in the drive circuit may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation, which require bonds between the semiconductor devices and metal substrates that can withstand higher temperatures and thermally-induced stresses due to CTE mismatch. The stress-relief features described and illustrated herein may reduce the thermally-induced stresses generated during thermal bonding of the semiconductor devices to the metal substrate by manageably controlling the thermal expansion and/or stiffness experienced by the layers of the metal substrate and semiconductor devices while also providing a compact package design.

It should now be understood that the stress-relief features of the metal substrates incorporated into the power electronics assemblies and vehicles described herein may be utilized to reduce thermally-induced stresses due to CTE mismatch without the need for additional interface layers, thereby providing for a more compact package design with reduced thermal resistance.

It is noted that the term "about" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics assembly comprising:
   a metal substrate comprising a thickness extending between a first surface and a second surface;
   an plurality of stress-relief features extending from the first surface towards the second surface;
   a transient liquid phase (TLP) bonding material within the plurality of stress-relief features; and
   a semiconductor device extending across the plurality of stress-relief features, wherein the semiconductor device is bonded to the metal substrate via the TLP bonding material.

2. The power electronics assembly of claim 1, wherein the TLP bonding material forms a plurality of pillars of TLP bonding material in the metal substrate.

3. The power electronics assembly of claim 2, wherein the semiconductor device is bonded to the metal substrate via the plurality of pillars of TLP bonding material.

4. The power electronics assembly of claim 1, wherein the TLP bonding material extends above the first surface and covers at least a portion of the first surface.

5. The power electronics assembly of claim 1, wherein the metal substrate comprises a bonding area defined by a footprint of the semiconductor device on the metal substrate, the plurality of stress-relief features extend from the first surface towards the second surface within the bonding area.

6. The power electronics assembly of claim 5, wherein the semiconductor device extends across and is bonded to the metal substrate at the bonding area.

7. The power electronics assembly of claim 6, wherein the plurality of stress-relief features occupy between about 20% and about 40% of a surface area of the bonding area.

8. The power electronics assembly of claim 1, wherein the metal substrate is formed from copper.

9. The power electronics assembly of claim 1, wherein the plurality of stress-relief features have an inner dimension d, a depth t, and an aspect ratio of t/d in the range of about 0.8 and about 1.2.

10. The power electronics assembly of claim 1, wherein the semiconductor device is formed from a wide band gap semiconductor material comprising at least one of silicon carbide (SiC), silicon dioxide ($SiO_2$), aluminum nitride (AlN), gallium nitride (GaN), boron nitride (BN) and diamond.

11. The power electronics assembly of claim 1, wherein the TLP bonding material is a silver-tin (Ag—Sn) TLP bonding material.

12. The power electronics assembly of claim 1, wherein the plurality of stress-relief features comprise a first portion with a side wall and a bottom surface, the side wall extending from the first surface of the metal substrate to the bottom surface.

13. The power electronics assembly of claim 12, wherein the plurality of stress-relief features further comprise a second portion extending from the bottom surface of the first portion towards the second surface of the metal substrate.

14. The power electronics assembly of claim 13, wherein the second portion extends from the bottom surface of the first portion to the second surface of the metal substrate.

* * * * *

UNITED STATES PATENT AND TRADEMARK OFFICE
CERTIFICATE OF CORRECTION

| | | |
|---|---|---|
| PATENT NO. | : 10,083,917 B1 | Page 1 of 1 |
| APPLICATION NO. | : 15/466176 | |
| DATED | : September 25, 2018 | |
| INVENTOR(S) | : Shailesh N. Joshi, Yanghe Liu and Ercan Mehmet Dede | |

It is certified that error appears in the above-identified patent and that said Letters Patent is hereby corrected as shown below:

In the Specification

In Column 04, Line 51, delete "alterative" and insert --alternative--, therefor.

In Column 04, Line 60, delete "alterative" and insert --alternative--, therefor.

In Column 07, Line 01, delete "length 1" and insert --length l--, therefor.

In Column 07, Line(s) 03 - 04, delete "length 1" and insert --length l--, therefor.

In Column 07, Line 06, delete "length 1" and insert --length l--, therefor.

In Column 07, Line 09, delete "length 1" and insert --length l--, therefor.

In the Claims

In Column 10, Claim 01, Line 05, delete "an plurality" and insert --a plurality--, therefor.

Signed and Sealed this
Twentieth Day of November, 2018

Andrei Iancu
*Director of the United States Patent and Trademark Office*